United States Patent
Kang et al.

(10) Patent No.: US 7,531,457 B2
(45) Date of Patent: *May 12, 2009

(54) METHOD OF FABRICATING SUSPENDED STRUCTURE

(75) Inventors: Yu-Fu Kang, Taipei (TW); Chen-Hsiung Yang, Taipei Hsien (TW)

(73) Assignee: Touch Micro-System Technology Inc., Yangmei Township, Taoyuan County (TW)

( * ) Notice: Subject to any disclaimer, the term of this patent is extended or adjusted under 35 U.S.C. 154(b) by 192 days.

This patent is subject to a terminal disclaimer.

(21) Appl. No.: 11/561,902

(22) Filed: Nov. 21, 2006

(65) Prior Publication Data

US 2007/0293023 A1 Dec. 20, 2007

(30) Foreign Application Priority Data

Jun. 19, 2006 (TW) .............................. 95121881 A (51) Int. Cl.
*H01L 21/20* (2006.01)

(52) U.S. Cl. .................. 438/680; 438/682; 438/683; 438/724; 438/736; 257/E23.012; 257/E21.273; 257/E21.576

(58) Field of Classification Search .................. 438/330, 438/412, 689, 680, 682, 683, 724, 736; 257/E21.17, 257/226, 334, 577, E23.012, E21.273, E21.576
See application file for complete search history.

(56) References Cited

U.S. PATENT DOCUMENTS

| 6,387,713 | B2 * | 5/2002 | Hara ............................. 438/3 |
| 6,620,576 | B2 * | 9/2003 | Raguin ...................... 430/321 |
| 7,393,784 | B2 * | 7/2008 | Kang .......................... 438/680 |
| 2002/0017132 | A1 | 2/2002 | McNie | |
| 2002/0125208 | A1 | 9/2002 | Christenson | |
| 2006/0057505 | A1 * | 3/2006 | Sadwick et al. ............. 430/320 |
| 2006/0070441 | A1 | 4/2006 | Durante | |
| 2006/0138076 | A1 | 6/2006 | Robert | |
| 2007/0207584 | A1 * | 9/2007 | Paranjpye et al. ........... 438/330 |
| 2007/0298613 | A1 * | 12/2007 | Kang .......................... 438/689 |

FOREIGN PATENT DOCUMENTS

| JP | 8-17016 | 1/1996 |
| JP | 8-227850 | 9/1996 |
| TW | 587059 | 5/2004 |
| TW | 590984 | 6/2004 |

* cited by examiner

*Primary Examiner*—Michael S Lebentritt
(74) *Attorney, Agent, or Firm*—Winston Hsu (57) ABSTRACT

A method of fabricating a suspended structure. First, a substrate including a photoresist layer hardened by heat is provided. Subsequently, the hardened photoresist layer is etched so as to turn the photoresist layer into a predetermined edge profile. Thereafter, a structure layer is formed on parts of the substrate and parts of the photoresist layer. Next, a dry etching process is performed so as to remove the photoresist layer, and to turn the structure layer into a suspended structure.

12 Claims, 14 Drawing Sheets

METHOD OF FABRICATING SUSPENDED STRUCTURE

BACKGROUND OF THE INVENTION

1. Field of the Invention

The present invention relates to a method of fabricating a suspended structure, and more particularly, to a method of using a hardened patterned photoresist layer to be a sacrificial layer, and adjusting the sidewall shape of the sacrificial layer for fabricating a suspended structure.

2. Description of the Prior Art

Micro-electromechanical systems (MEMS) are modern technology, which coordinate electrical circuits and mechanics. MEMS have been applied to fabricate devices with both electrical circuits and mechanical elements, such as pressure sensors, accelerators, and micro-microphones. The suspended structure is applied in many MEMS devices such as a MEMS switch, an inkjet nozzle, and micro-microphones, etc., but the method of fabricating a suspended structure according to the prior art still has many limitations.

Figure 1:
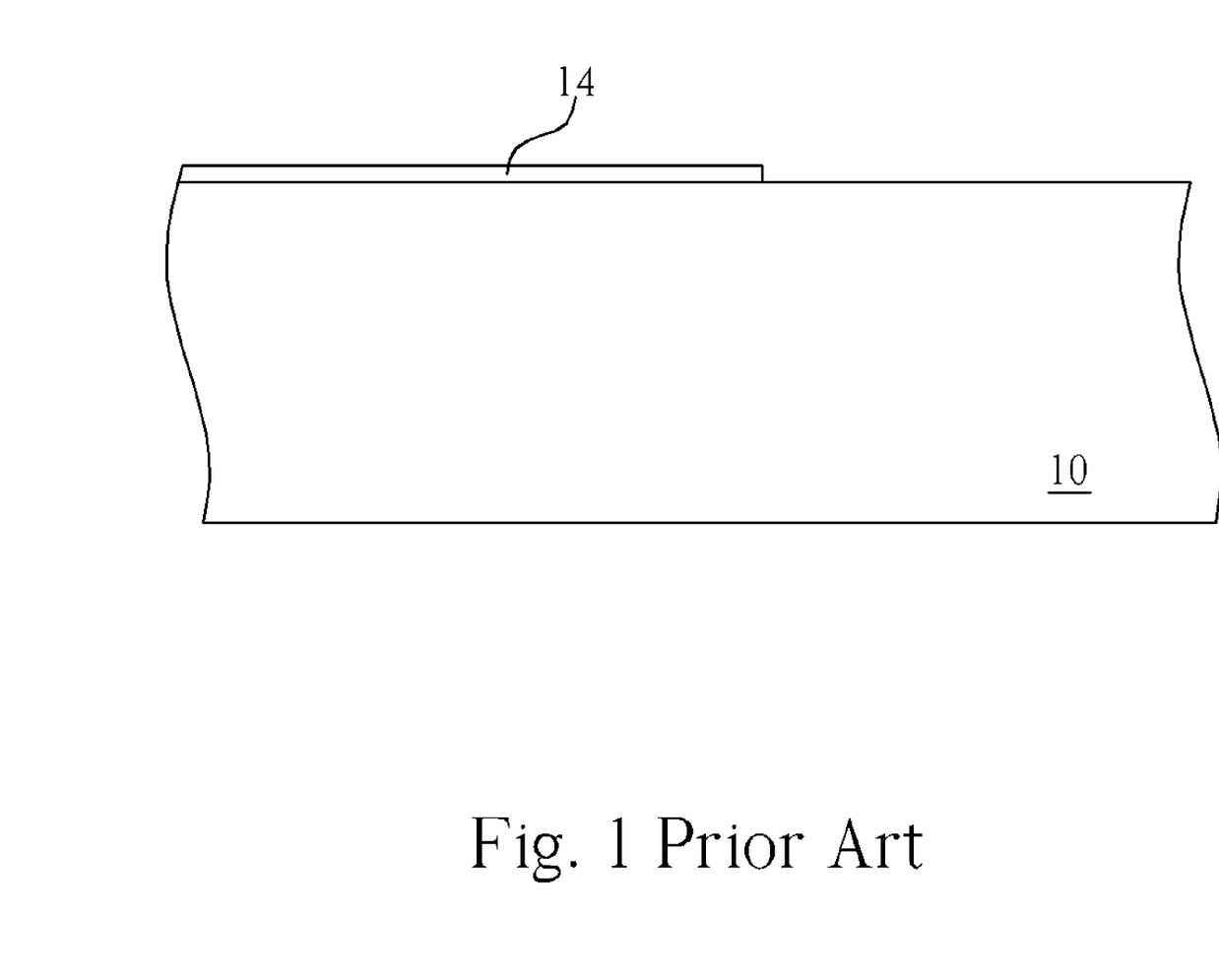
FIG. 1 and FIG. 2 show the method of fabricating a suspended structure by using wet etching process according to the prior art.
Figure 2:
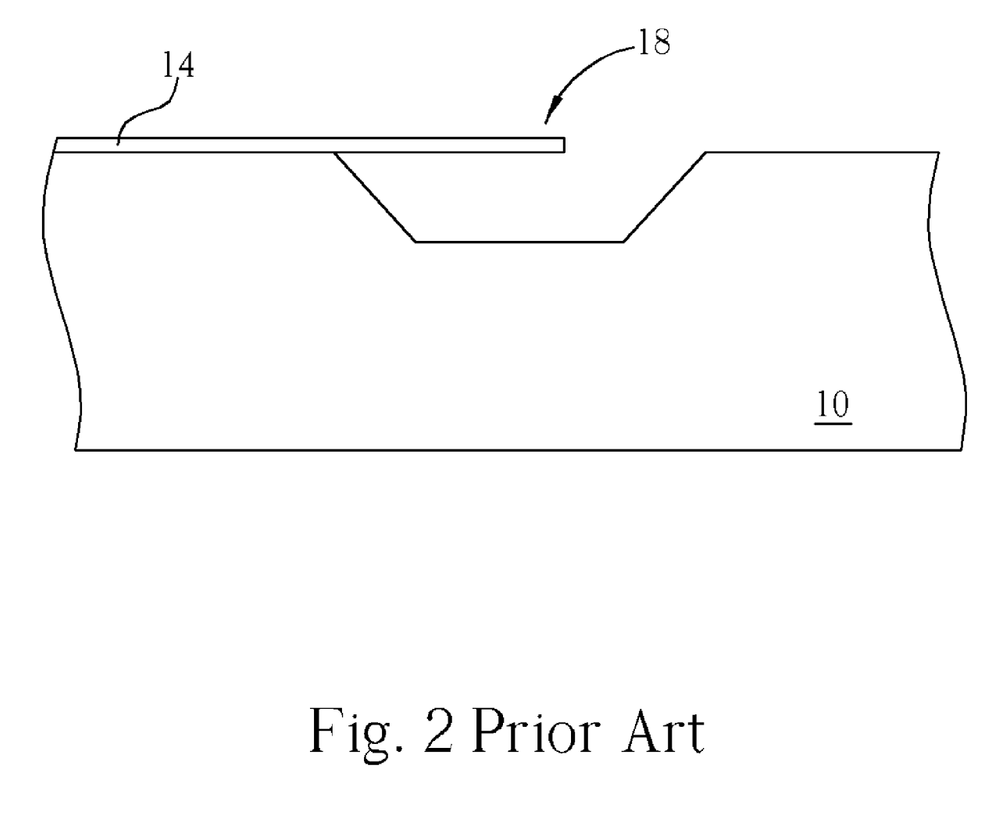

Please refer to FIG. 1 and FIG. 2. FIG. 1 and FIG. 2 show the method of fabricating a suspended structure 18 by using a wet etching process according to the prior art. As shown in FIG. 1, a substrate 10 is first provided, and the upper surface of the substrate 10 includes a patterned structure layer 14 thereon. As shown in FIG. 2, a patterned photoresist layer (not shown in the figure) is formed on the substrate 10 and the structure layer 14, and a wet etching process is substantially performed. During the wet etching process, a part of the substrate 10 is etched through the opening of the patterned photoresist layer by an etching solution, and a suspended structure 18 is therefore formed. After that, the patterned photoresist layer is removed.

In general, the material of the substrate 10 is silicon, and the wet etching process uses a potassium hydroxide (KOH) solution as an etching solution to remove the substrate 10 so as to form the suspended structure. Because the prior art method utilizes the wet etching process to form a hole under the suspended structure 18, the material of the structure layer 14 must be limited to particular metals that can sustain the etching solution. Otherwise, other material layers, such as a patterned photoresist layer, must be formed on the structure layer 14 to protect the structure layer 14. Furthermore, the prior art method cannot produce various suspended structures 18 having different inclined angles, so it cannot satisfy some required designs of the products.

On the other hand, the etching solution of the wet etching process often damages the structure layer 14, or results in ion pollution in the components. For example, the strength of the suspended structure 18 may be decreased by the surface tension of the KOH solution, so the suspended structure 18 collapses easily and sticks to the substrate 10. The substrate 10 and the structure layer 14 may be polluted by potassium ions ($K^+$) in the KOH solution, which decreases the whole yield of the fabricating process.

SUMMARY OF THE INVENTION

An object of the present invention is to provide a method of fabricating a suspended structure that utilizes a hardened patterned photoresist layer to be a sacrificial layer so as to solve the problems of the prior art.

According to the claimed invention, the present invention provides a method of fabricating a suspended structure. Accordingly, a substrate is first provided. The substrate comprises a first patterned photoresist layer thereon. Subsequently, the first patterned photoresist layer is heated so as to harden the first patterned photoresist layer and to round an edge of the first patterned photoresist layer. Next, the first patterned photoresist layer is etched so that a sidewall shape of the first patterned photoresist layer is adjusted. A second patterned photoresist layer is thereafter formed on the substrate. The second patterned photoresist layer exposes a part of the first patterned photoresist layer and a part of the substrate. Furthermore, a structure layer is formed on the substrate, the first patterned photoresist layer, and the second patterned photoresist layer. Next, a lift off process is performed to remove the second patterned photoresist layer and the structure layer above the second patterned photoresist layer. Thereafter, a dry etching process is performed to remove the first patterned photoresist layer so that the structure layer turns into the suspended structure.

According to another claimed invention, a method of fabricating a suspended structure is provided. First, a substrate is provided. The substrate comprises a first patterned photoresist layer thereon. Subsequently, the first patterned photoresist layer is heated so as to harden the first patterned photoresist layer. Furthermore, an etching mask is formed on the first patterned photoresist layer and the substrate. The etching mask exposes a part of the first patterned photoresist layer. Next, the first patterned photoresist layer not covered by the etching mask is etched so that the first patterned photoresist layer has a predetermined shape. The etching mask is thereafter removed. Moreover, a structure layer is formed on the substrate and the first patterned photoresist layer. A dry etching process is next performed to remove the first patterned photoresist layer so that the structure layer turns into the suspended structure.

Because the present invention uses a hardened patterned photoresist layer to be a sacrificial layer, the sidewall shape of the suspended structure can be adjusted to satisfy a variety of products, and the patterned photoresist layer can be removed by a dry etching process.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
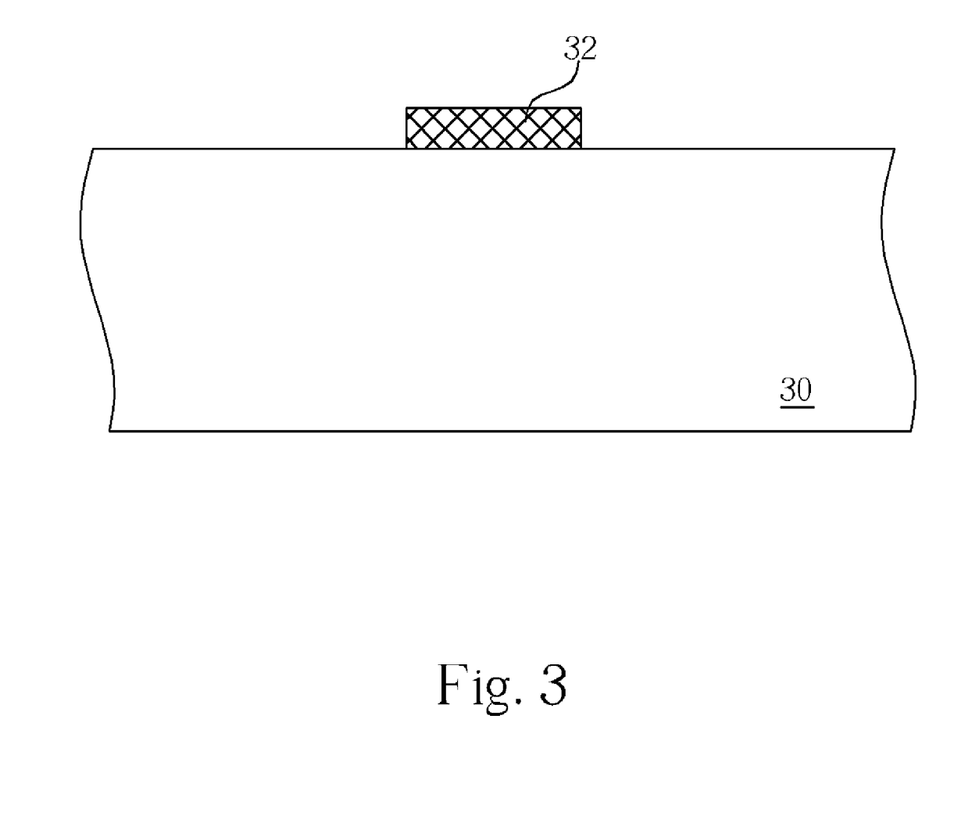
FIG. 3 through FIG. 13 illustrate a method of fabricating a suspended structure in accordance with a preferred embodiment of the present invention.
Figure 4:
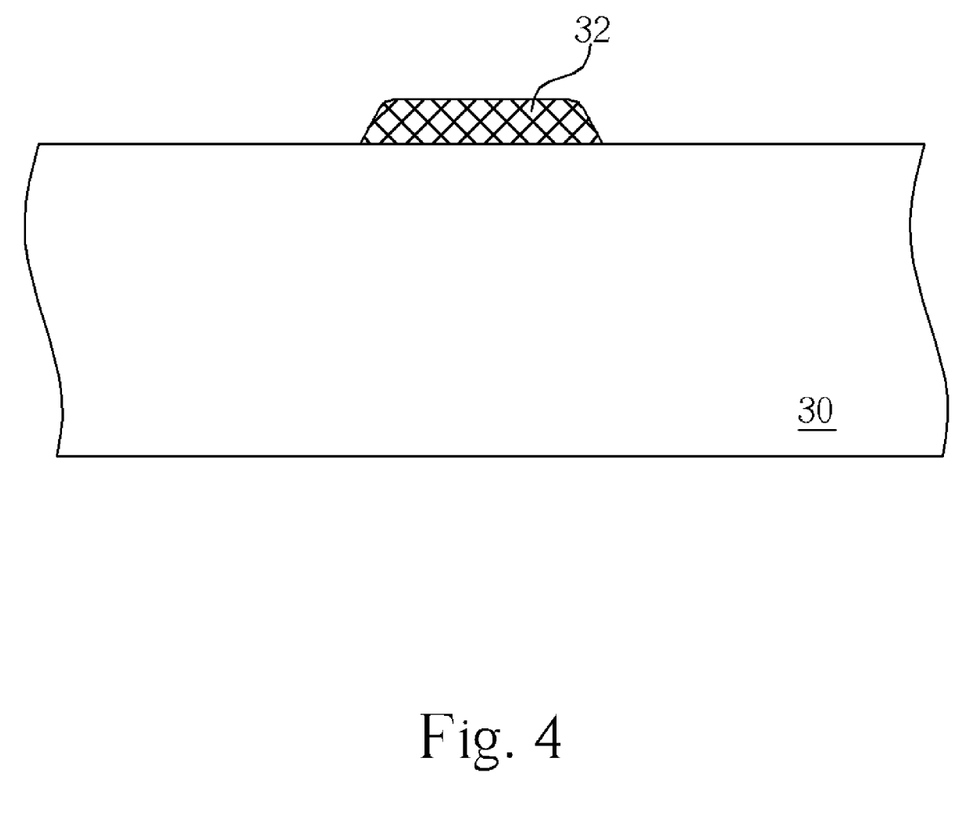
Figure 12:
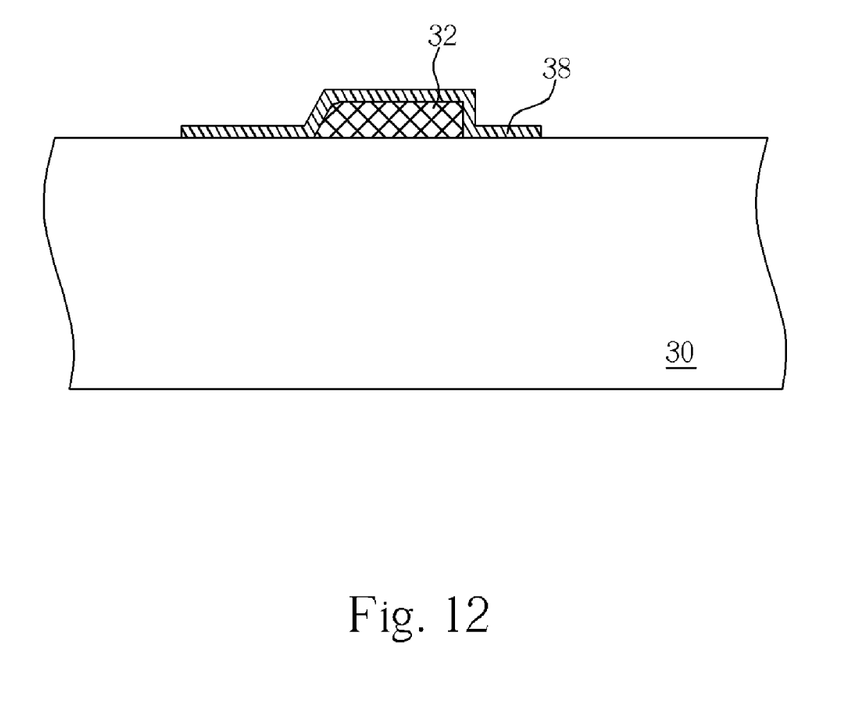
Figure 13:
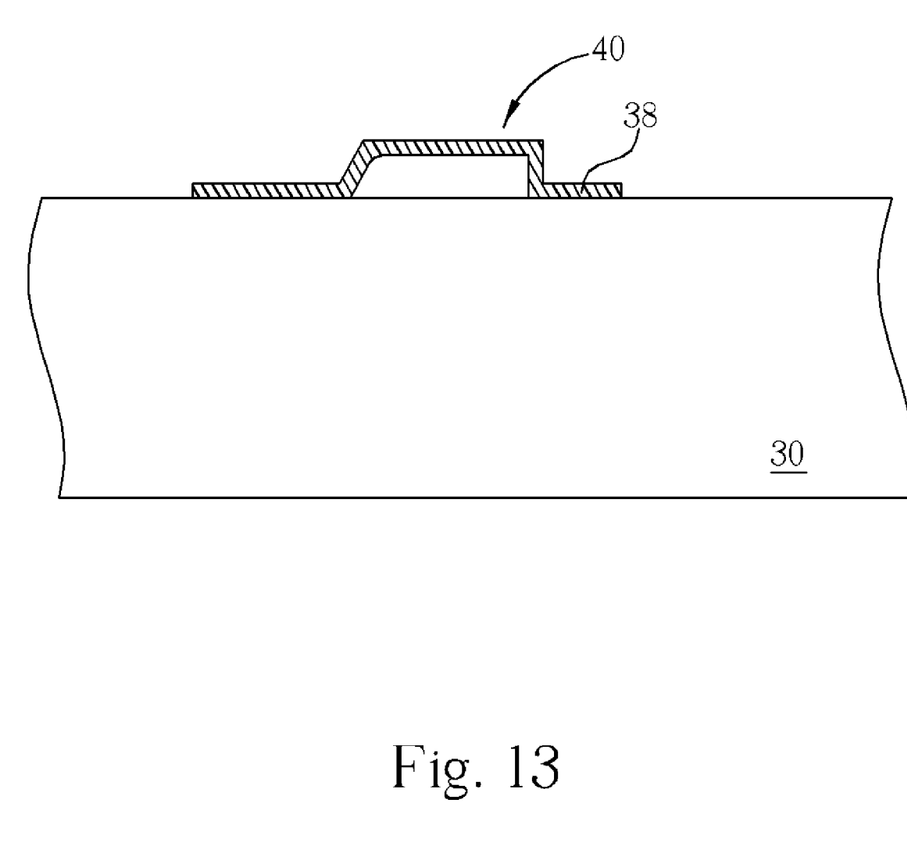
Figure 14:
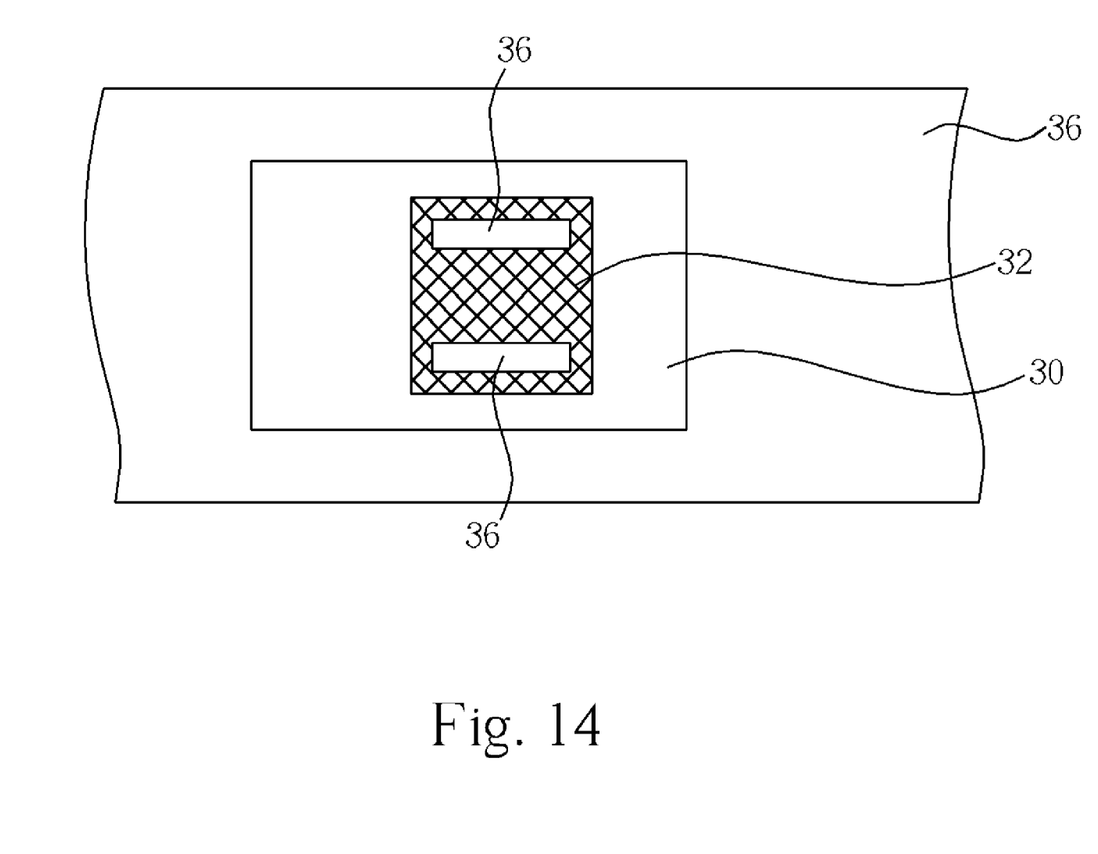
FIG. 14 shows a top view of the suspended structure in FIG. 10.

Please refer to FIG. 3 through FIG. 14. FIG. 3 through FIG. 13 illustrate a method of fabricating a suspended structure 40 in accordance with a preferred embodiment of the present invention, and FIG. 14 shows a top view of the suspended structure 40 in FIG. 10. As shown in FIG. 3, a substrate 30 is first provided, and a first patterned photoresist layer 32 is included on the front surface of the substrate 30, where the substrate 30 can be a silicon wafer or a SOI substrate, but is not limited to this. Substantially, as shown in FIG. 4, the first patterned photoresist layer 32 is heated. The heating process 32 can use an oven or heating plate to bake the substrate 30 and the first patterned photoresist layer 32. The solution in the first patterned photoresist layer 32 is therefore decreased. As a result, the attaching ability of the first patterned photoresist layer 32 is increased, the first patterned photoresist layer 32 is hardened, and an edge of the first patterned photoresist layer 32 is simultaneously rounded.

Figure 5:
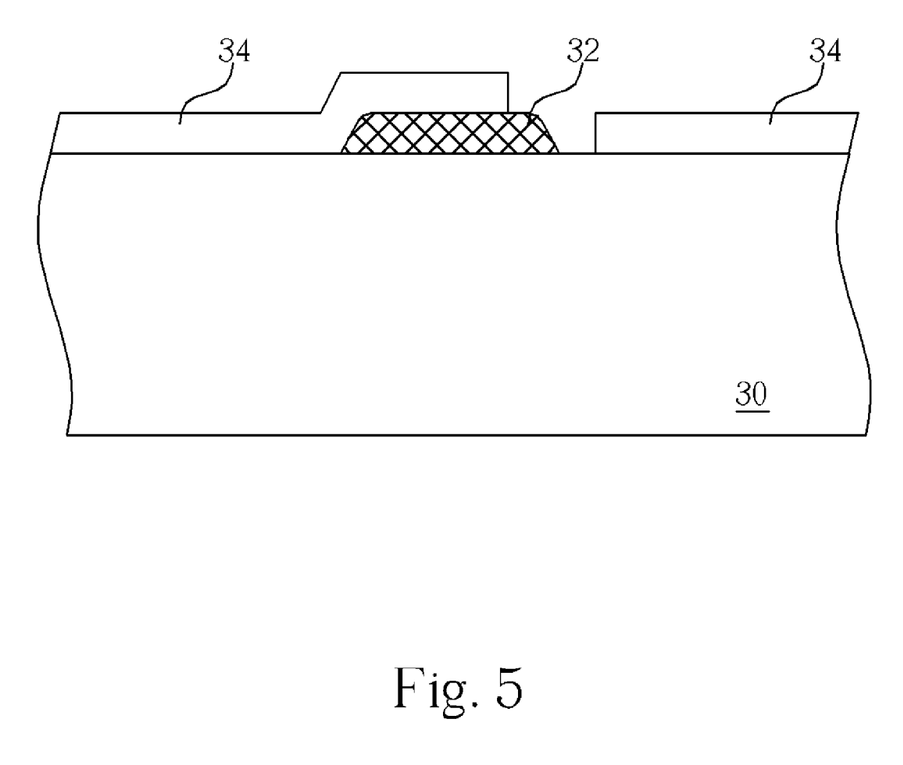
Figure 6:
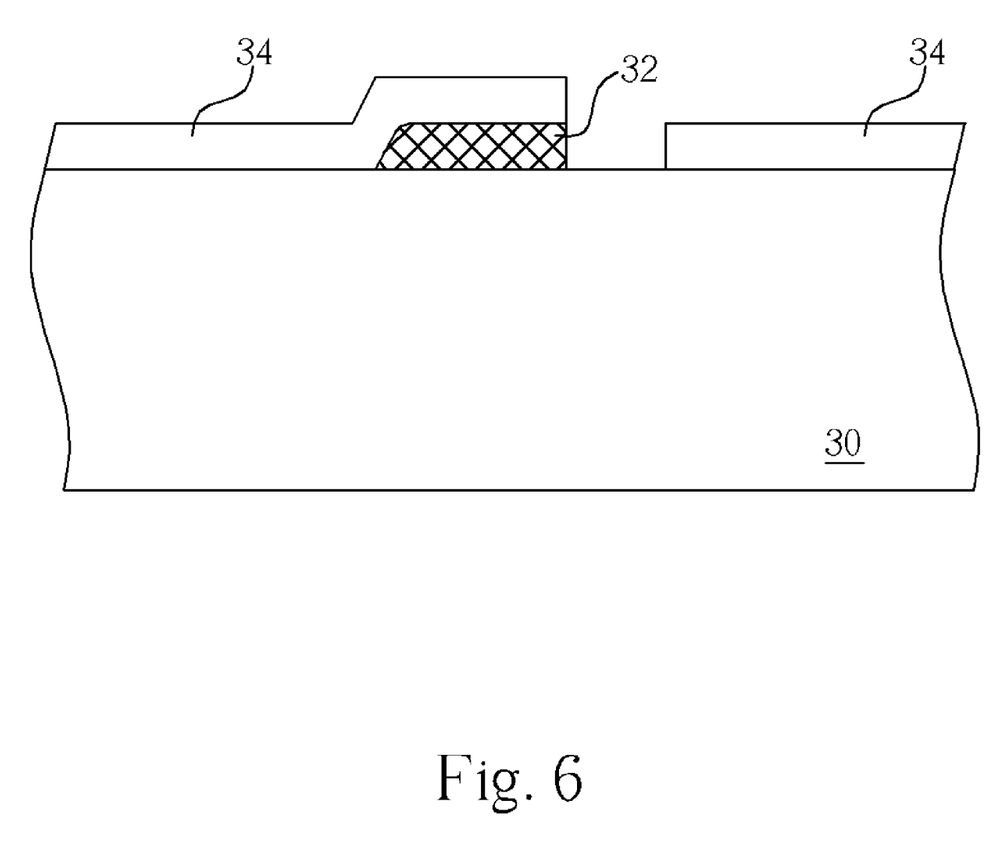
Figure 7:
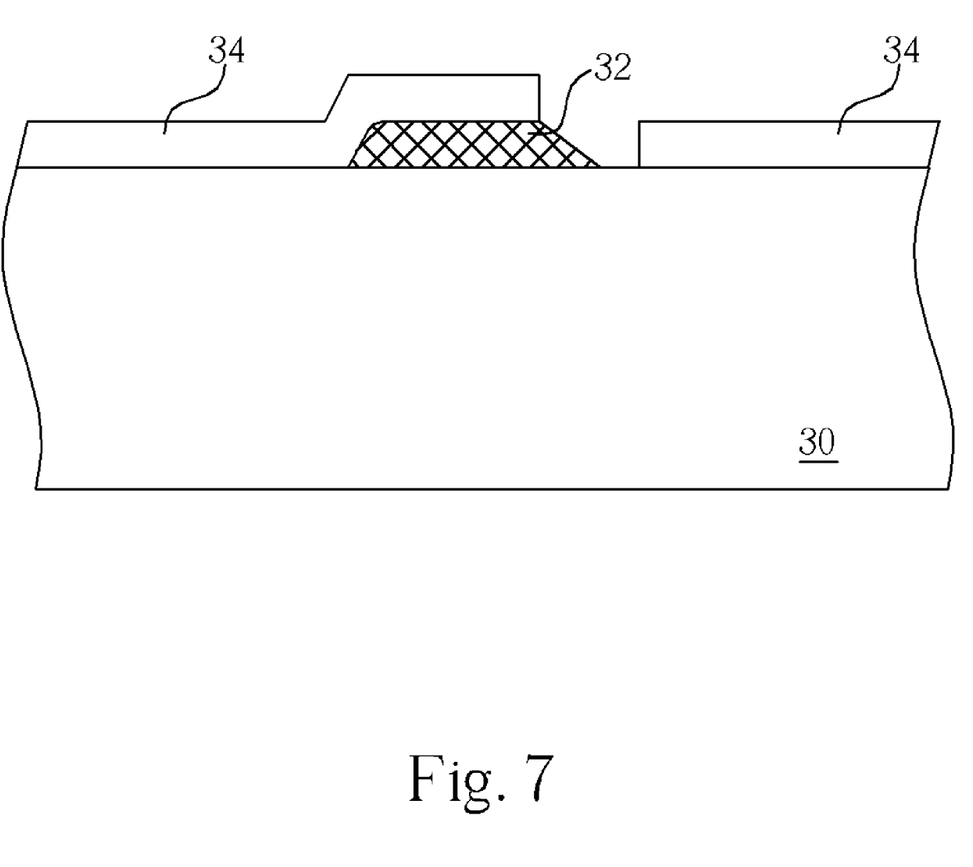
Figure 8:
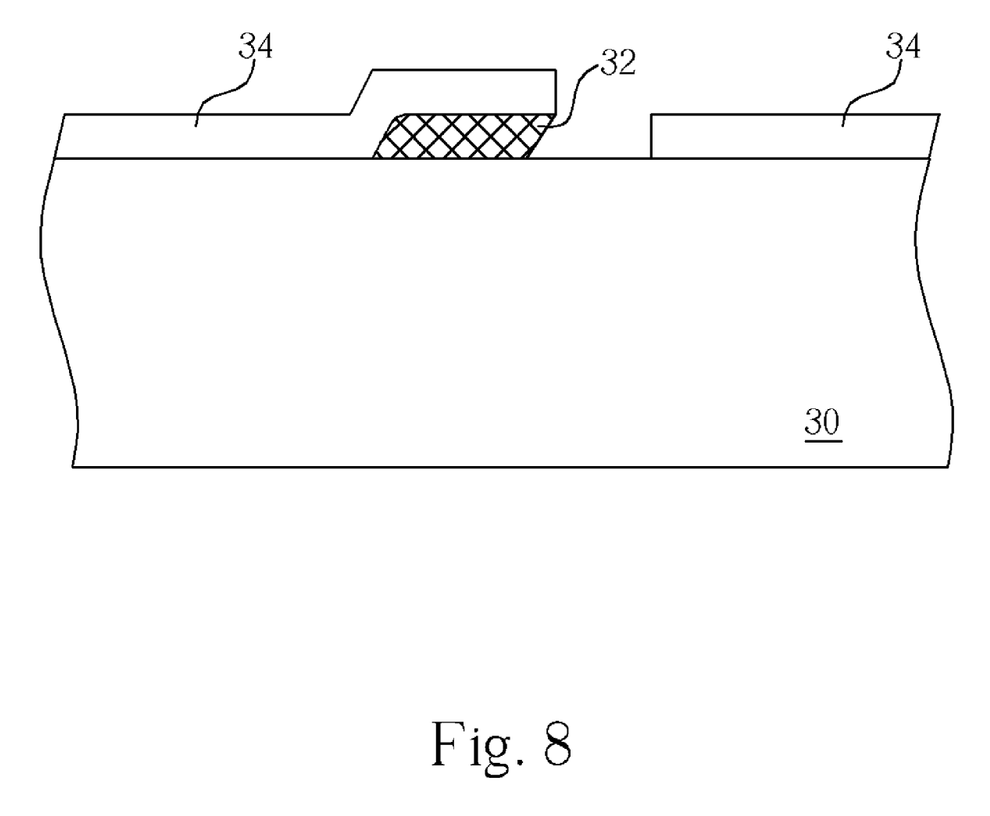
Figure 9:
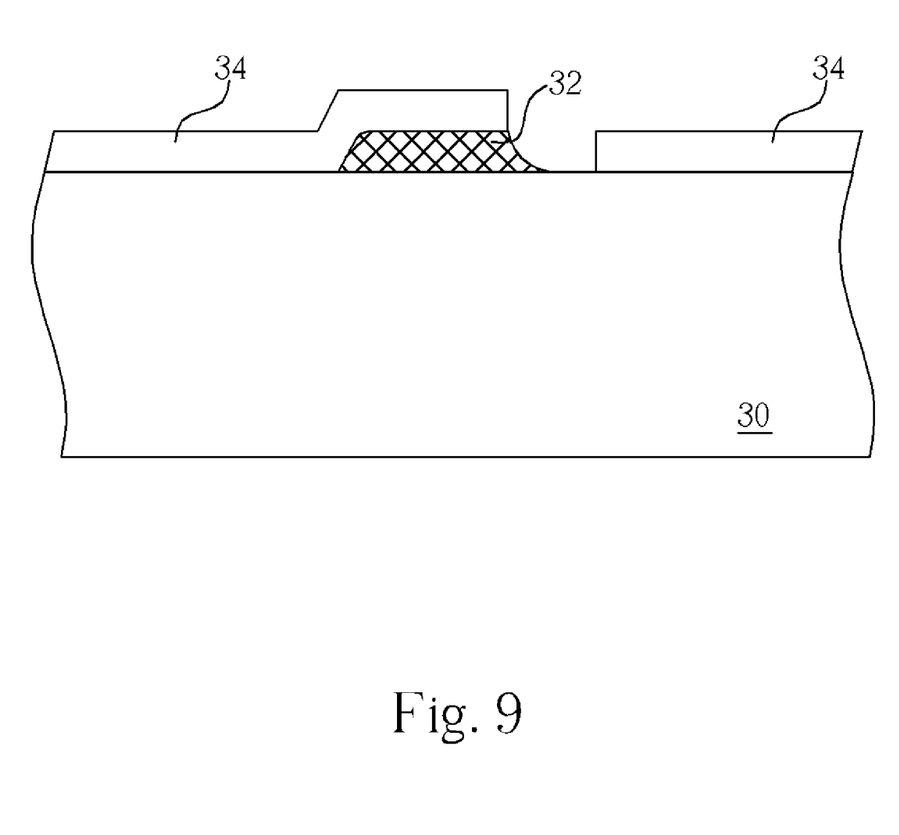

As shown in FIG. 5, an etching mask 34 is thereafter formed on the substrate 30 and the first patterned photoresist layer 32. The etching mask 34 exposes a part of the first patterned photoresist layer 32. For example, an edge of the first patterned photoresist layer 32 that should be adjusted is exposed. The etching mask 34 can include materials, such as metal, silicon, oxide or nitride, depending on the processes' requirements. As shown in FIG. 6, an etching process is performed to etch a part of the first patterned photoresist layer 32 through the opening of the etching mask 34 so that the first patterned photoresist layer has a vertical sidewall. It should be noted that the etching process could be adjusted according to the required component structure of different products. For instance, the process of etching the first patterned photoresist layer 32 can include a plasma etching process or a reactive ion etching (RIE) process, and the shape of the first patterned photoresist layer 32 can be changed by adjusting these process parameters. In addition to the vertical sidewall shown in FIG. 6, the first patterned photoresist layer can include an outwardly inclined sidewall shown in FIG. 7, an inwardly inclined sidewall shown in FIG. 8, or even an arc sidewall according to the present invention shown in FIG. 9.

Figure 10:
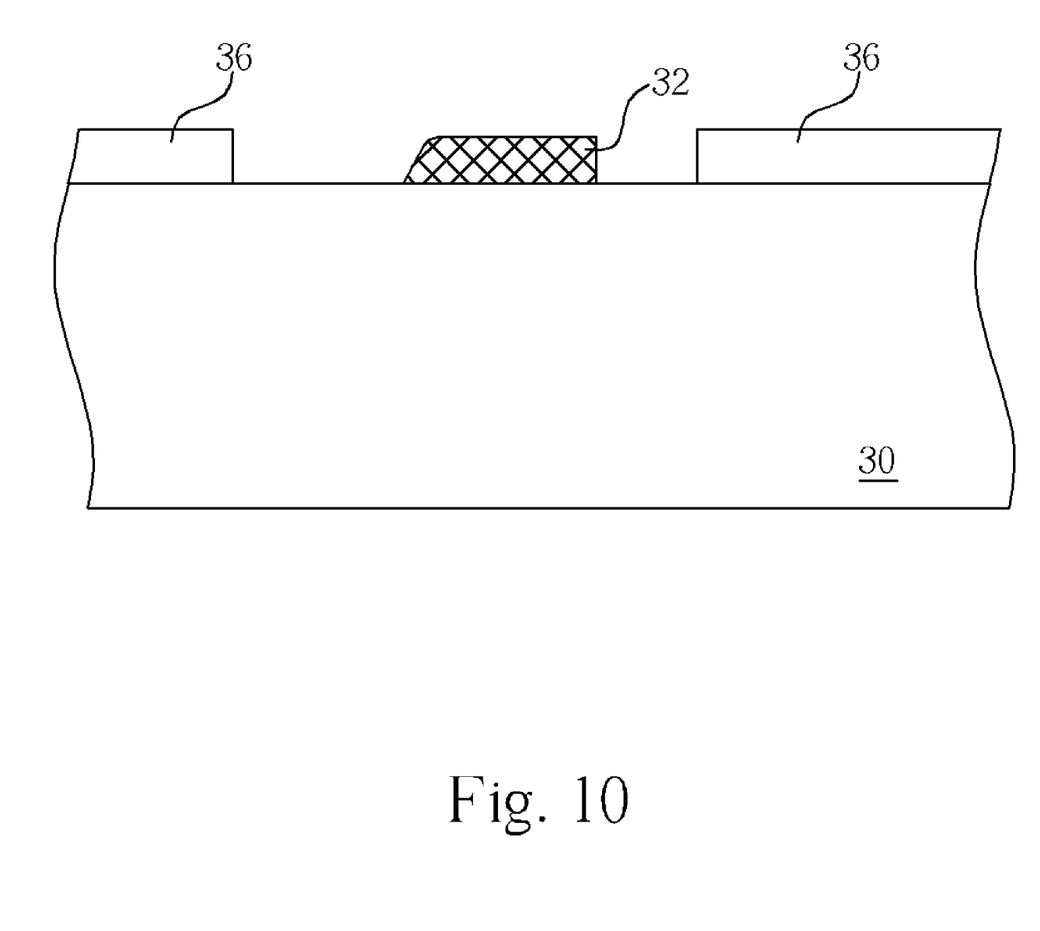
Figure 11:
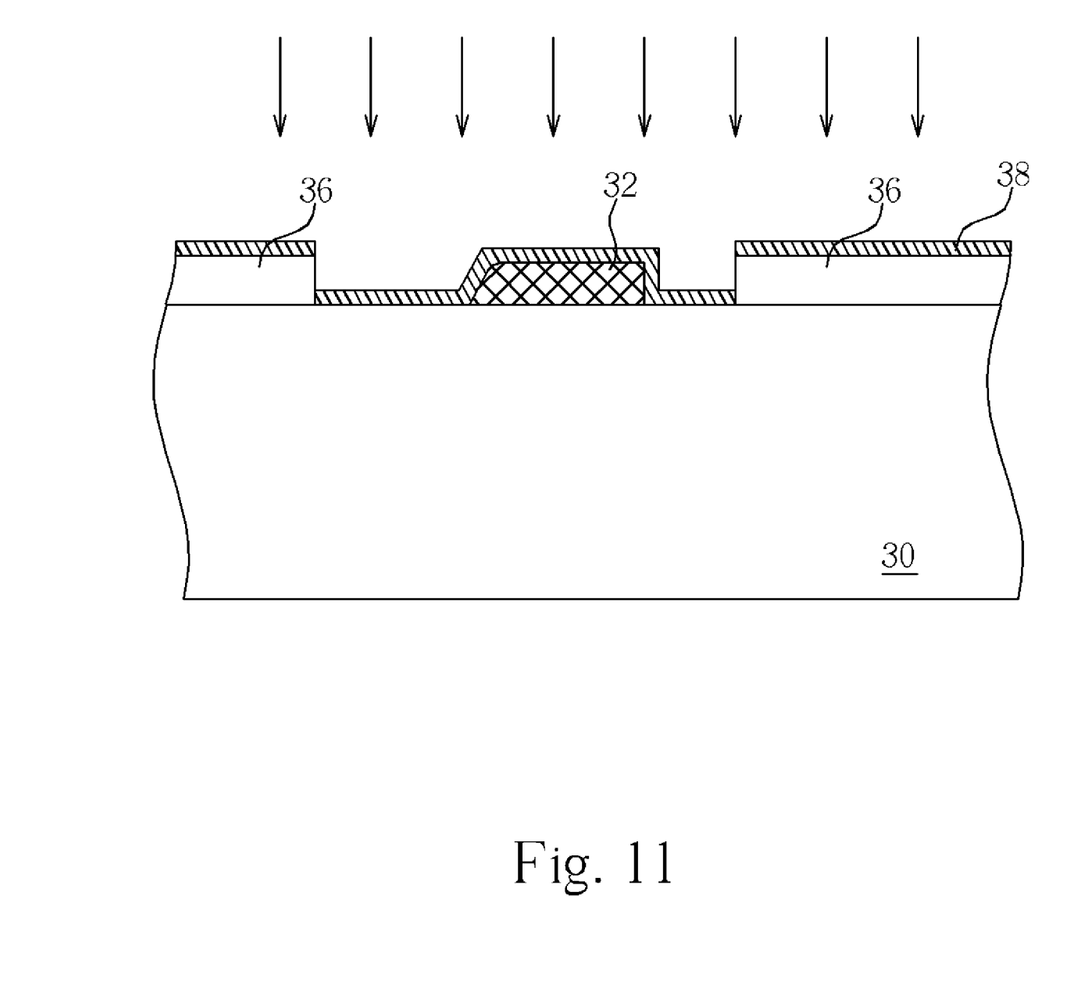

As shown in FIG. 10 and FIG. 14, the etching mask 34 is removed after the required sidewall of the first patterned photoresist layer 32 is shaped, and a second patterned photoresist layer 36 is thereafter formed on the substrate 30. The second patterned photoresist layer 36 exposes a part of the substrate 30 and a part of the first patterned photoresist layer 32, where the exposed regions are at the predetermined positions of the suspended structure's structure layer. As shown in FIG. 11, after the second patterned photoresist layer 36 is formed, a structure layer 38 is formed on the substrate 30, the first patterned photoresist layer 32, and the second patterned photoresist layer 36. The structure layer 38 in this embodiment is a metal layer formed by deposition process, but the material of the structure layer 38 is not limited to this. The structure layer 38 might include kinds of metals, single crystal silicon, amorphous silicon polysilicon, or other proper materials. Different process, such as a chemical vapor deposition (CVD) process, a physical vapor deposition (PVD) process or a coating process, can be performed according to the needed materials of the structure layer 38.

Next, as shown in FIG. 12, a lift off process is performed. The lift off process can remove the second patterned photoresist layer 36 by wet etching, and parts of the structure layer 38 above the second patterned photoresist layer 36 can also be removed accordingly. Simultaneously, parts of the structure layer 38 above the substrate 30 and parts of the structure layer 38 above the first patterned photoresist layer 32 remain. Furthermore, as shown in FIG. 13, a dry etching process, such as a dry chemical etching process or a RIE process, is performed to remove the first patterned photoresist layer 32. Therefore, the remaining structure layer 38 above the substrate 30 becomes the suspended structure 40.

In summary, because the present invention uses a hardened patterned photoresist layer to be a sacrificial layer of the suspended structure, the patterned photoresist layer can be removed by a dry etching process. It prevents a surface tension of a wet etching solution from destroying the strength of the suspended structure, and protects the suspended structure from collapsing and sticking to the substrate. In addition, since the heated photoresist is round on its edge, the follow-up structure layer can closely cover on the heated photoresist, and the present invention prevents a bad covering condition in the corners. Therefore, the suspension structure will not be broken easily. Accordingly, the method of the present invention provides a better protection for the suspended structure, and increases the whole yield of the fabricating process.

On other hand, the present invention can easily control the shape of the photoresist by various etching processes, so the sidewalls of the suspended structure can include at least two different inclined angles. As a result, the sidewall shape of the suspended structure can be easily adjusted to satisfy a variety of products, and the cost of the manufacturing process is reduced. Furthermore, since the method of the present invention utilizes the patterned photoresist layer to be the sacrificial layer, and the patterned photoresist layer is removed by a dry etching process, the material of the structure layer is no longer to be limited to particular metals that can sustain the KOH solution. Any metal or material, which can deposit and coat on the surface of the photoresist layer, can be applied to the structure layer in the present invention. Therefore, the suspended structure can include more variations, and satisfy more designs of the products due to the various materials of the structure layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a suspended structure comprising:
   providing a substrate, the substrate comprising a first patterned photoresist layer thereon;
   heating the first patterned photoresist layer so as to harden the first patterned photoresist layer and to round an edge of the first patterned photoresist layer;
   etching the first patterned photoresist layer to adjust a sidewall shape of the first patterned photoresist layer;
   forming a second patterned photoresist layer on the substrate, the second patterned photoresist layer exposing a part of the first patterned photoresist layer and a part of the substrate;
   forming a structure layer on the substrate, the first patterned photoresist layer, and the second patterned photoresist layer;
   performing a lift off process to remove the second patterned photoresist layer and the structure layer above the second patterned photoresist layer; and
   performing a dry etching process to remove the first patterned photoresist layer so that the structure layer turns into the suspended structure.

2. The method of claim 1, wherein the step of etching the first patterned photoresist layer to adjust the sidewall shape of the first patterned photoresist layer comprises:
   forming an etching mask on the first patterned photoresist layer, the etching mask exposing a part of the first patterned photoresist layer;
   etching the first patterned photoresist layer; and
   removing the etching mask.

3. The method of claim 1, wherein the structure layer comprises metal, single crystal silicon, amorphous silicon, or polysilicon.

4. The method of claim 1, wherein the dry etching process comprises a dry chemical etching process or a reactive ion etching process.

5. A method of fabricating a suspended structure comprising:
   providing a substrate, the substrate comprising a first patterned photoresist layer thereon;
   heating the first patterned photoresist layer so as to harden the first patterned photoresist layer;
   forming an etching mask on the first patterned photoresist layer and the substrate, the etching mask exposing a part of the first patterned photoresist layer;
   etching a part of the first patterned photoresist layer not covered by the etching mask so that the first patterned photoresist layer comprises a predetermined shape;
   removing the etching mask;
   forming a structure layer on the substrate and the first patterned photoresist layer; and
   performing a dry etching process to remove the first patterned photoresist layer so that the structure layer turns into the suspended structure.

6. The method of claim 5, wherein the predetermined shape of the first patterned photoresist layer comprises a vertical sidewall.

7. The method of claim 5, wherein the predetermined shape of the first patterned photoresist layer comprises an outwardly inclined sidewall.

8. The method of claim 5, wherein the predetermined shape of the first patterned photoresist layer comprises an inwardly inclined sidewall.

9. The method of claim 5, wherein the etching mask comprises metal.

10. The method of claim 5, wherein the structure layer comprises metal, single crystal silicon, amorphous silicon, or polysilicon.

11. The method of claim 5, wherein the step of etching the first patterned photoresist layer not covered by the etching mask comprises a plasma etching process or a reactive ion etching process.

12. The method of claim 5, wherein the dry etching process comprises a dry chemical etching process or a reactive ion etching process.

* * * * *